(12) United States Patent
Baek et al.

(10) Patent No.: US 11,366,167 B2
(45) Date of Patent: Jun. 21, 2022

(54) SYSTEM AND METHOD FOR MANAGING BATTERY OF VEHICLE

(71) Applicants: HYUNDAI MOTOR COMPANY, Seoul (KR); KIA MOTORS CORPORATION, Seoul (KR)

(72) Inventors: Ki Seung Baek, Hwaseong-si (KR); Jong Seo Yoon, Incheon (KR); Do Sung Hwang, Gunpo-si (KR); Jae Hoon Choi, Gunpo-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 17/109,621

(22) Filed: Dec. 2, 2020

(65) Prior Publication Data
US 2022/0011368 A1 Jan. 13, 2022

(30) Foreign Application Priority Data
Jul. 8, 2020 (KR) .................. 10-2020-0084030

(51) Int. Cl.
*G01R 31/36* (2020.01)
*G01R 31/382* (2019.01)
(Continued)

(52) U.S. Cl.
CPC ....... *G01R 31/3648* (2013.01); *G01R 31/382* (2019.01); *H01M 10/425* (2013.01); *H01M 10/48* (2013.01); *H01M 2010/4271* (2013.01)

(58) Field of Classification Search
None
See application file for complete search history.

(56) References Cited

U.S. PATENT DOCUMENTS 5,781,013 A 7/1998 Takahashi
5,869,951 A 2/1999 Takahashi
(Continued)

FOREIGN PATENT DOCUMENTS

CN 110065394 A 7/2019
EP 2295282 A2 3/2011
(Continued)

OTHER PUBLICATIONS

Song et al. ("Dynamic SOC Compensation of an Ultracapacitor Module for a Hybrid Energy Storage System" (2009) Journal of Power Electronics, p. 769-776) (Year: 2009).*

(Continued)

*Primary Examiner* — Roy Y Yi
(74) *Attorney, Agent, or Firm* — Morgan, Lewis & Bockius LLP (57) ABSTRACT

A system for managing a battery of a vehicle includes a battery, a main relay connected to the battery to transfer or block power of the battery to components in the vehicle, and a controller. The controller is configured to control the components in the vehicle to be in a power-off (IG OFF) state and turning off the main relay when receiving a vehicle power-off input, and to determine whether or not the battery is abnormal by calculating a parameter for determining a state of the battery and comparing the calculated parameter with a plurality of reference values that are preset.

15 Claims, 5 Drawing Sheets

(51) Int. Cl.
*H01M 10/42* (2006.01)
*H01M 10/48* (2006.01)

(56) References Cited

U.S. PATENT DOCUMENTS

| | | | |
|---|---|---|---|
| 2012/0072144 A1* | 3/2012 | Zhang | G01R 31/3828 |
| | | | 702/63 |
| 2013/0207592 A1* | 8/2013 | Okada | B60L 58/16 |
| | | | 320/106 |
| 2014/0159670 A1 | 6/2014 | Lee et al. | |
| 2016/0207415 A1 | 7/2016 | Sato et al. | |
| 2017/0361791 A1 | 12/2017 | Yoon et al. | |
| 2018/0115178 A1 | 4/2018 | Moon et al. | |
| 2018/0260019 A1 | 9/2018 | Kim et al. | |
| 2020/0180464 A1 | 6/2020 | Jang et al. | |
| 2020/0185943 A1 | 6/2020 | Youn et al. | |
| 2020/0233450 A1 | 7/2020 | Giri et al. | |

FOREIGN PATENT DOCUMENTS

| | | |
|---|---|---|
| JP | H08-126104 A | 5/1996 |
| JP | 2003-063330 A | 3/2003 |
| JP | 2007-230398 A | 9/2007 |
| KR | 10-2010-0085791 A | 1/2009 |
| KR | 10-2013-0061964 A | 6/2013 |
| KR | 10-1477272 A | 12/2014 |
| KR | 10-2018-0056091 A | 5/2018 |

OTHER PUBLICATIONS

Extended European Search Report dated May 28, 2021 issued in European Patent Application No. 20211495.
Extended European Search Report dated Oct. 6, 2021, issued in corresponding European Patent Application No. 20211178.7.

* cited by examiner

SYSTEM AND METHOD FOR MANAGING BATTERY OF VEHICLE

CROSS REFERENCE TO RELATED APPLICATION

The present application claims priority to Korean Patent Application No. 10-2020-0084030, filed Jul. 8, 2020, the entire contents of which is incorporated herein for all purposes by this reference.

TECHNICAL FIELD

The present disclosure relates to a system and a method for managing a battery of a vehicle, and more particularly, to a system and a method for managing a battery of a vehicle capable of performing a different alert depending on how serious a state of the battery is by calculating parameters for determining the state of the battery when the battery of the vehicle is in a no-load state and comparing the calculated parameters with a plurality of reference values.

BACKGROUND

In general, an eco-friendly vehicle driven using electric energy is a vehicle that generates power by driving a motor, which is an electromotive rotating mechanism, using electric energy stored in a battery. The dynamic performance of the eco-friendly vehicle is very closely related with the performance of the battery. It is thus essential to efficiently monitor and manage the battery.

The battery of the eco-friendly vehicle is normally managed by a controller that is commonly called a battery management system (BMS). The battery management system calculates various parameters for managing the battery by collecting various information (a battery voltage, a battery current, a battery temperature, etc.) for managing the battery from the battery and applying the collected information to various pre-stored algorithms.

A technique for managing a battery of a vehicle according to the related art is performed mainly in a state where power is supplied to the battery management system, i.e. in a power-on (IG ON) state. That is, a state of the battery is determined in a state where a main relay connected to the battery forms an electrical connection between the battery and other components of the vehicle (e.g. a power module converting power of the battery and providing the converted power to a motor or a charger generating power for charging the battery).

In the technique for managing a battery of a vehicle according to the related art, information for managing the battery is collected in a state where the battery and other components are electrically connected to each other, and thus, it is not possible to appropriately check a state of the battery in a state where controllers in the vehicle are powered off (IG-OFF state), for example, at the time of dielectric breakdown due to flooding after the main relay is opened.

In addition, in the technique for managing a battery of a vehicle according to the related art, even though the state of the battery is determined to be abnormal, simple control is performed merely to block an internal current flow, and thus, it is not possible to prevent a severe problem such as ignition of the battery in advance.

The contents described as the related art have been provided only to assist in understanding the background of the present disclosure and should not be considered as corresponding to the related art known to those having ordinary skill in the art.

SUMMARY

An object of the present disclosure is to provide a system and a method for managing a battery of a vehicle capable of efficiently determining and alerting an abnormal state of the battery in a no-load state where a relay connected to the battery of the vehicle is turned off and controllers in the vehicle are turned off.

According to an embodiment of the present disclosure, a system for managing a battery of a vehicle includes a battery, a main relay connected to the battery to transfer or block power of the battery to components in the vehicle, and a controller. The controller is configured to control the components in the vehicle to be in a power-off (IG OFF) state and turning off the main relay when receiving a vehicle power-off input, and to determine whether or not the battery is abnormal by calculating a parameter for determining a state of the battery and comparing the calculated parameter with a plurality of reference values that are preset.

The plurality of reference values may include a first reference value and a second reference value for determining that an abnormal state of the battery is more serious as compared with the first reference value.

When it is determined that the battery is abnormal as a result of comparing the parameter with the first reference value, the controller may compare the parameter with the second reference value to determine whether or not the battery is abnormal.

The controller may compare the parameter with both the first reference value and the second reference value at the same time to determine whether or not the battery is abnormal.

When it is determined that the battery is abnormal as a result of comparing the parameter with the first reference value, the controller may store an error code and display an alert corresponding to the error code on a cluster of the vehicle when the vehicle is powered on.

When it is determined that the battery is abnormal as a result of comparing the parameter with the second reference value, the controller may wake up an audio video navigation (AVN) system in the vehicle, transmit information indicating that the battery is abnormal to an external server through the AVN system, and control the vehicle not to be started when an input for powering on the vehicle is generated.

The controller may calculate an insulation resistance of the battery as the parameter, and the second reference value may be smaller than the first reference value.

When a deterioration degree of the battery or an accumulated mileage of the vehicle is smaller than a preset threshold value, the controller may calculate a voltage deviation between battery cells in the battery as the parameter, and the second reference value may be greater than the first reference value.

The controller may include a first controller and a second controller, and after turning off the main relay, the second controller may receive power from the battery to determine whether or not the battery is abnormal by calculating the parameter and comparing the calculated parameter with the plurality of reference values.

According to another embodiment of the present disclosure, a method for managing a battery of a vehicle including a battery and a main relay connected to the battery to transfer or block power of the battery to components in the vehicle includes: controlling the components in the vehicle to be in a power-off (IG OFF) state and turning off the main relay, by a controller, when a vehicle power-off input is received; and determining whether or not the battery is abnormal by calculating a parameter for determining a state of the battery and comparing the calculated parameter with a plurality of reference values that are preset, by the controller.

The plurality of reference values may include a first reference value and a second reference value for determining that an abnormal state of the battery is more serious as compared with the first reference value.

When it is determined that the battery is abnormal as a result of comparing the parameter with the first reference value in the determining of whether or not the battery is abnormal, the controller may compare the parameter with the second reference value to determine whether or not the battery is abnormal.

In the determining of whether or not the battery is abnormal, the controller may compare the parameter with both the first reference value and the second reference value at the same time to determine whether or not the battery is abnormal.

The method may further include storing an error code and displaying an alert corresponding to the error code on a cluster of the vehicle when the vehicle is powered on, by the controller, when it is determined that the battery is abnormal as a result of comparing the parameter with the first reference value in the determining of whether or not the battery is abnormal.

The method may further include waking up an audio video navigation (AVN) system in the vehicle, transmitting information indicating that the battery is abnormal to an external server through the AVN system, and controlling the vehicle not to be started when an input for powering on the vehicle is generated, by the controller, when it is determined that the battery is abnormal as a result of comparing the parameter with the second reference value in the determining of whether or not the battery is abnormal.

In the determining of whether or not the battery is abnormal, the controller may calculate an insulation resistance of the battery as the parameter, and the second reference value may be smaller than the first reference value.

In the determining of whether or not the battery is abnormal, when a deterioration degree of the battery or an accumulated mileage of the vehicle is smaller than a preset threshold value, the controller may calculate a voltage deviation between battery cells in the battery as the parameter, and the second reference value may be greater than the first reference value.

DETAILED DESCRIPTION OF THE EMBODIMENTS

Hereinafter, a system and a method for managing a battery of a vehicle according to embodiments of the present disclosure will be described in detail with reference to the accompanying drawings.

Figure 1:
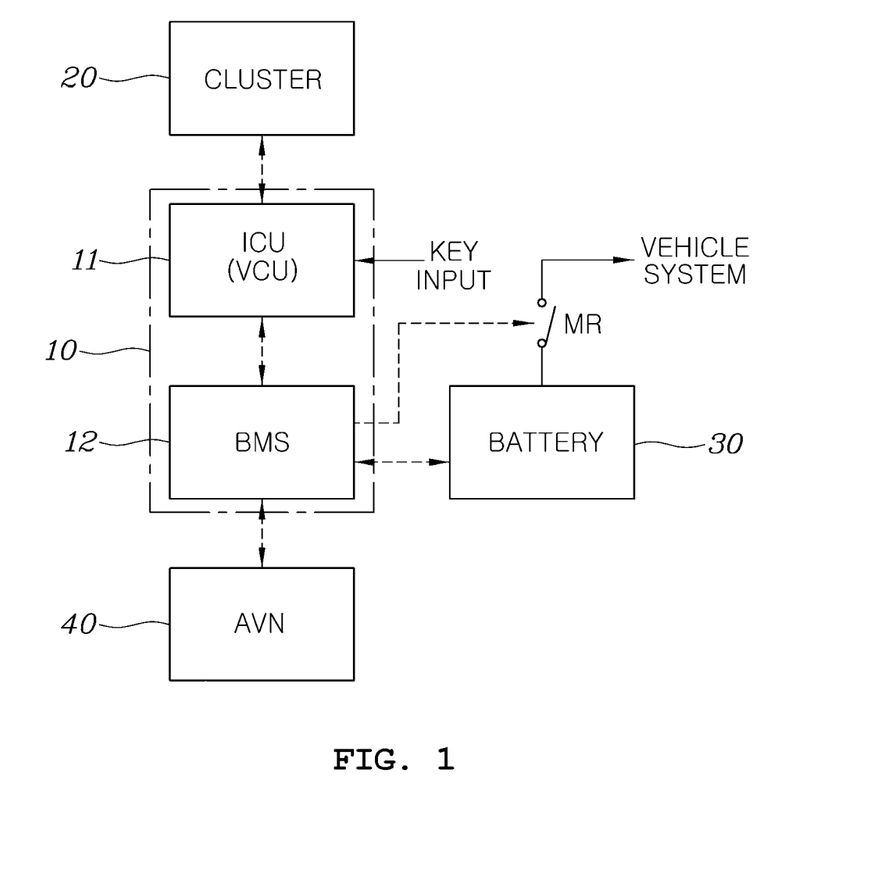
FIG. 1 is a block diagram of a system for managing a battery of a vehicle according to an embodiment of the present disclosure.

FIG. 1 is a block diagram of a system for managing a battery of a vehicle according to an embodiment of the present disclosure.

Referring to FIG. 1, the system for managing a battery of a vehicle according to an embodiment of the present disclosure may include a controller 10 including: a first controller 11 controlling a plurality of controllers in the vehicle to be in a power-on (IG ON) state or in a power-off (IG OFF) state and controlling a cluster 20 of the vehicle; and a second controller 12 controlling a state of a main relay MR connected to a battery 30 of the vehicle, determining a state of the battery by calculating a parameter for determining a state of the battery 30 and comparing the calculated parameter with a reference value, and providing a determination result to the first controller 11 and/or an audio video navigation (AVN) system 40 of the vehicle.

In addition, the battery 30 may be a main battery (or a high voltage battery) of the vehicle supplying energy to a driving motor that generates power for driving the vehicle or charged by receiving regenerative energy of the driving motor.

In a general vehicle control system, the first controller 11 controlling the cluster 20 and controlling power relays (IG relays) of the controllers to power on/off the controllers may be an integrated central control unit (ICU) or a vehicle control unit (VCU).

In addition, in the general vehicle control system, the second controller 12 calculating a parameter for determining a state of the battery 30 and controlling the main relay MR connected to the battery 30 to be turned on/off may be a battery management system (BMS).

In describing various embodiments of the present disclosure, the first controller 11 and the second controller 12 may be collectively referred to as the controller 10 controlling various components or systems in the vehicle.

The first controller 11 in the controller 10 may receive an external key input (an input by a driver through a start button) to control the controllers in the vehicle to be in a power-on (IG ON) state or in a power-off (IG OFF) state. For example, when the driver generates a vehicle power-off input by pressing the start button after finishing driving the vehicle and parking the vehicle, the first controller 11 may receive the input and turn off the power relays (IG relays) of the controllers such that the controllers are in the power-off (IG OFF) state.

When the power-off control is performed by the first controller 11, the second controller 12 turns off the main relay MR such that the battery 30 is in a no-load state, while maintaining power using a power latch function.

Here, the power latch function is a function for maintaining the second controller 12 in a power-supplied state for a predetermined time utilizing a power line connected directly to a power supply, if needed, even when the power-off (IG OFF) control of the first controller 11 is generated.

In the related art, after turning off the main relay MR, the second controller 12 becomes a shutdown state, i.e. in a power-off state, and thus, does not determine a state of the battery 30 that is in a no-load state. However, in various embodiments of the present disclosure, even after turning off the main relay MR, the second controller 12 may calculate a parameter indicating a state of the battery 30 to determine an abnormal state of the battery 30. In order to control the state of the battery 30 after the battery 30 is in the no-load state, the second controller 12 may be maintained in the power-on state continuously as long as power is supplied from the power supply or be intermittently powered on at preset intervals to conserve the power from the power supply to determine an abnormal state of the battery 30.

In an embodiment of the present disclosure, after turning off the main relay MR, the second controller 12 may calculate a parameter indicating a state of the battery 30, and then compare one calculated parameter with each of a plurality of reference values to take an appropriate action for each of the results.

For example, the second controller 12 may measure an insulation resistance of the battery 30 and compare the measured insulation resistance with a plurality of reference values. The second controller 12 may first compare the measured insulation resistance with a first reference value, and compare the measured insulation resistance with a second reference value, which is smaller than the first reference value, when the measured insulation resistance is smaller than the first reference value.

The first reference value and the second reference value are preset values for determining that the insulation resistance is abnormal. The second reference value is a reference value for determining that an abnormal state of the insulation resistance is more serious as compared with the first reference value.

The second controller 12 may store an error code when the measured insulation resistance of the battery 30 is smaller than the first reference value, and transmit the error code to the first controller 11 when being in a power-on (IG ON) state, and the first controller 11 may light a service lamp to display the error code corresponding to an abnormality of the insulation resistance of the battery 30 or an abnormality of the battery on the cluster 20 in the vehicle, thereby inducing the driver to have the battery checked.

Meanwhile, when the measured insulation resistance of the battery is smaller than the second reference value, which indicates that the abnormality of the battery 30 is more serious, the second controller 12 may operate to immediately alert the abnormality of the battery 30. For example, the second controller 12 may inform the first controller 11 of the abnormality of the battery, and the first controller 11 may control the vehicle to be in a power-on (IG ON) state to wake up the AVN system 40 of the vehicle. Subsequently, the second controller 12 may transmit the abnormality state of the battery to the AVN system 40 such that the AVN system 40 conveys the abnormality of the battery to an external server. Thereafter, the server may inform an emergency dispatch center or a vehicle owner's terminal of the abnormality of the battery, so that the battery can be immediately checked. Furthermore, the first controller 11 notified of the abnormality of the battery from the second controller 12 may determine that the vehicle is not permitted to be restarted or charged. The error code may be stored in the second controller 12 and lighted on the cluster 20 in the same manner as when the insulation resistance is compared with the first reference value.

Here, the AVN system 40, which is a system providing an occupant in the vehicle with various information for driving the vehicle and for the entertainment in the vehicle, for example playing and displaying audio and video contents in the vehicle and providing navigation information, may include a wireless communication module for performing wireless communication with the external server.

In the above-described example, the insulation resistance has been compared with the first reference value, and then compared with the second reference value when the insulation resistance is abnormal based on the first reference value. However, the insulation resistance may be compared with the first reference value and the second reference value substantially at the same time, and an alert may be performed depending on a comparison result.

As another example, the second controller 12 may measure a voltage deviation between a plurality of battery cells constituting the battery 30 and compare the measured voltage deviation with a plurality of reference values. The second controller 12 may first compare the measured voltage deviation between battery cells with a first reference value, and compare the measured voltage deviation between battery cells with a second reference value, which is greater than the first reference value, when the measured voltage deviation between battery cells is greater than the first reference value.

The first reference value and the second reference value are preset values for determining that the voltage deviation between battery cells is abnormal. The second reference value is a reference value for determining that an abnormal state of the voltage deviation between battery cells is more serious, as compared with the first reference value.

In particular, in the process of determining an abnormal state of the battery using the voltage deviation between battery cells, the second controller 12 may determine whether or not a deterioration degree of the battery 30 or an accumulated mileage (odometer value) of the vehicle is smaller than a preset reference value. When the deterioration degree of the battery or the mileage of the vehicle is high, which indicates that the battery has already been used for a long period, a predetermined level or higher of voltage deviation between battery cells may occur. However, when the deterioration degree of the battery or the mileage of the vehicle is low, a measured voltage deviation between battery cells should be very small. Thus, when the voltage deviation between battery cells is great in spite of a low deterioration degree of the battery or a low mileage of the vehicle, it may be determined that the battery is abnormal.

The second controller 12 may store an error code when the measured voltage deviation between battery cells of the battery 30 is greater than the first reference value, and transmit the error code to the first controller 11 when being in a power-on (IG ON) state, and the first controller 11 may light a service lamp to display the error code corresponding to an abnormality of the voltage deviation between battery cells of the battery 30 or an abnormality of the battery on the cluster 20 in the vehicle, so that the driver is induced to have the battery checked.

Meanwhile, when the measured voltage deviation between battery cells of the battery is greater than the second reference value, which indicates that the abnormality of the battery 30 is more serious, the second controller 12 may operate to immediately alert the abnormality of the battery 30. For example, the second controller 12 may inform the first controller 11 of the abnormality of the battery, and the first controller 11 may control the vehicle to be in a power-on (IG ON) state to wake up the AVN system 40 of the vehicle. Subsequently, the second controller 12 may transmit the abnormality state of the battery to the AVN system 40 such that the AVN system 40 conveys the abnormality of the battery to the external server. Thereafter, the server may inform an emergency dispatch center or a vehicle owner's terminal of the abnormality of the battery, so that the battery 30 can be immediately checked. Furthermore, the first controller 11 notified of the abnormality of the battery from the second controller 12 may determine that the vehicle is not permitted to be restarted or charged. An error code may be stored in the second controller 12 and lighted on the cluster 20 in the same manner as when the voltage deviation between battery cells of the battery 30 is compared with the first reference value.

In the above description, the insulation resistance of the battery, the voltage deviation between battery cells, the deterioration degree of the battery, or the like, which is a parameter or a comparison parameter for determining a state of the battery 30, may be calculated by a calculation algorithm preset by the second controller 12, which corresponds to the BMS, using battery information (a voltage, a current, a temperature, a cell voltage, etc.) collected through various sensors and the like installed in the battery. Various algorithms for calculating such parameters have already been known in the art, and the second controller 12 may calculate the above-described parameters using some of the various known calculation algorithms. In particular, the voltage variation between battery cells may be defined as a difference between a maximum value and a minimum value among voltages of the plurality of battery cells in the battery 30.

FIGS. 2 to 5 are flowcharts illustrating a method for managing a battery of a vehicle according to an embodiment of the present disclosure.

Figure 2:
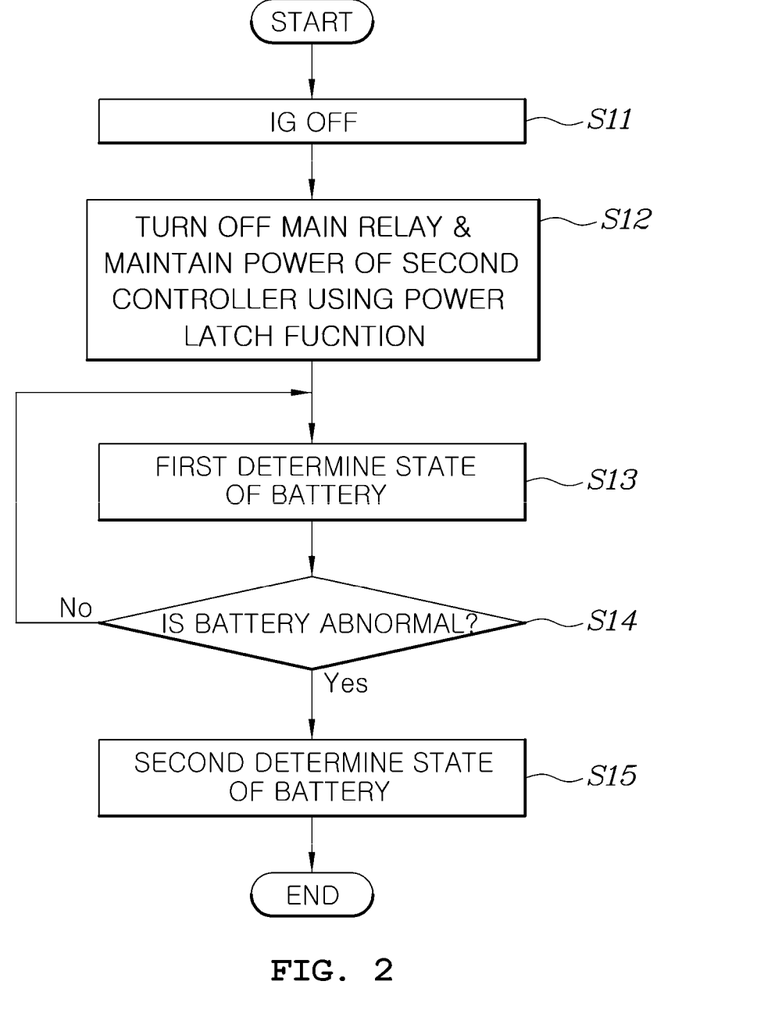
FIGS. 2 to 5 are flowcharts illustrating a method for managing a battery of a vehicle according to an embodiment of the present disclosure.
Figure 3:
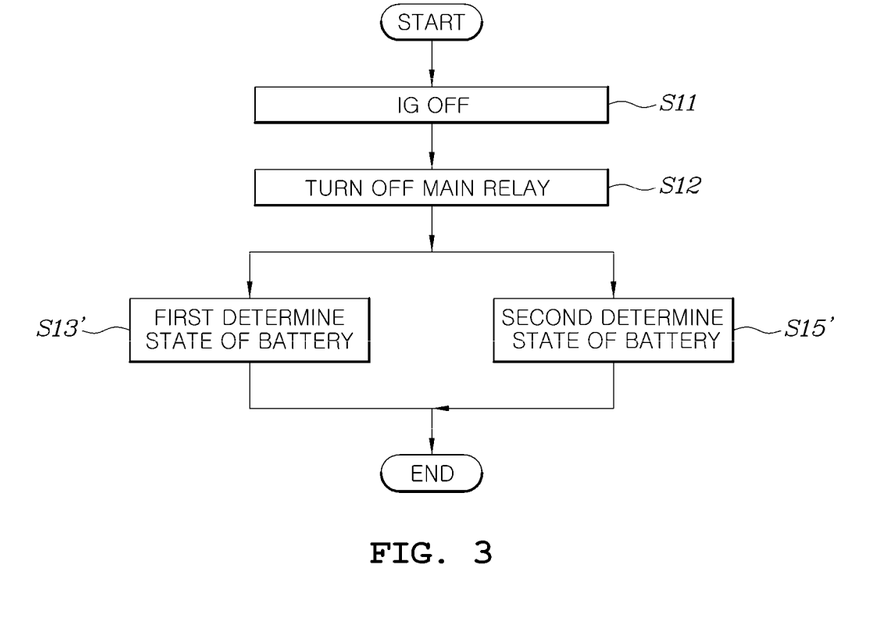

As illustrated in FIGS. 2 and 3, in the method for managing a battery of a vehicle according to an embodiment of the present disclosure, the first controller 11 may receive a vehicle power-off input and turn off power relays (IG relays) of controllers and components in the vehicle to be in a power-off (IG OFF) state (S11). When the power-off control is performed by the first controller 11, the second controller 12 may turn off the main relay MR such that the battery 30 is in a no-load state, while maintaining power using a power latch function (S12).

Subsequently, as illustrated in FIG. 2, the second controller 12 may perform a step of calculating a parameter for determining a state of the battery and comparing the calculated parameter with a first reference value (S13), and when it is determined through the comparison with the first reference value that the battery is abnormal (S14), the second controller 12 may perform a step of determining an abnormal state of the battery by comparing the parameter with the second reference value for determining that the abnormal state of the battery is more serious (S15).

Alternatively, as another example illustrated in FIG. 3, after the battery 30 is in the no-load state, a step of calculating a parameter and comparing the calculated parameter with a first reference value (S13') may be performed simultaneously with a step of calculating a parameter and comparing the calculated parameter with a second reference value (S15').

Figure 4:
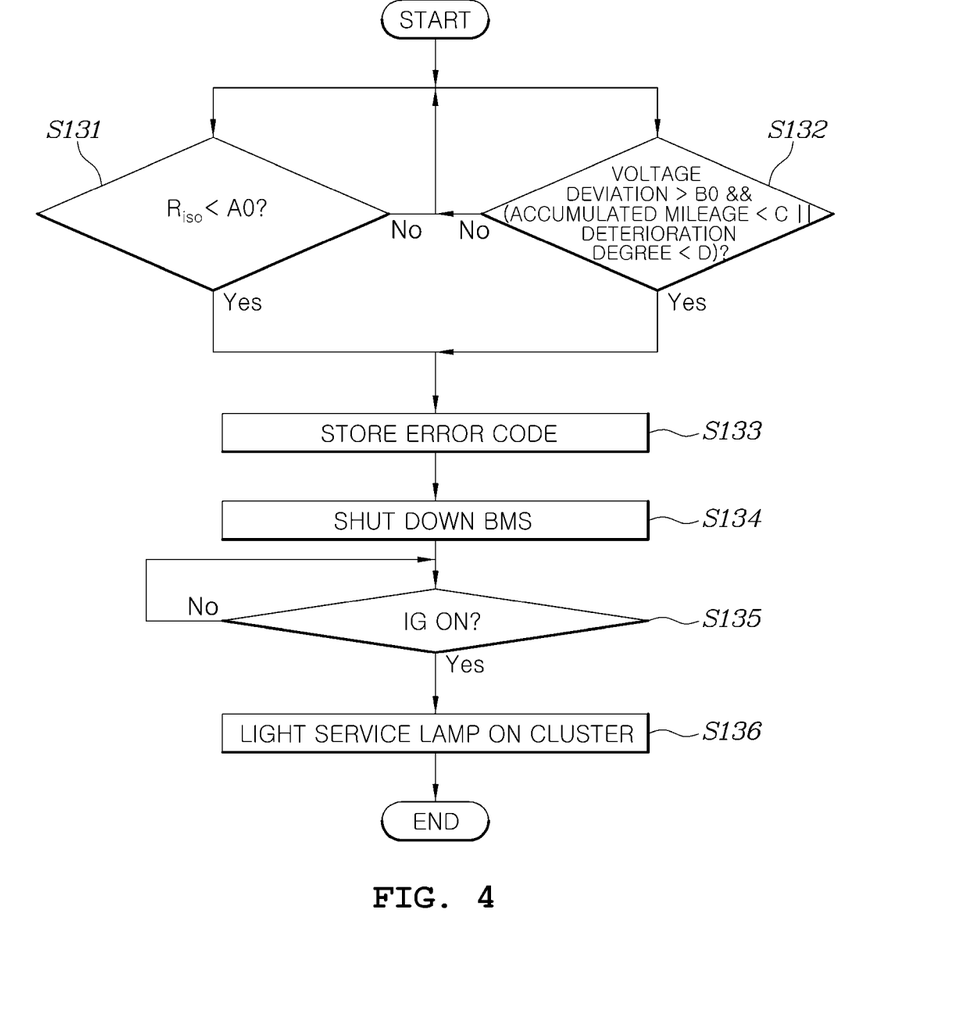
Figure 5:
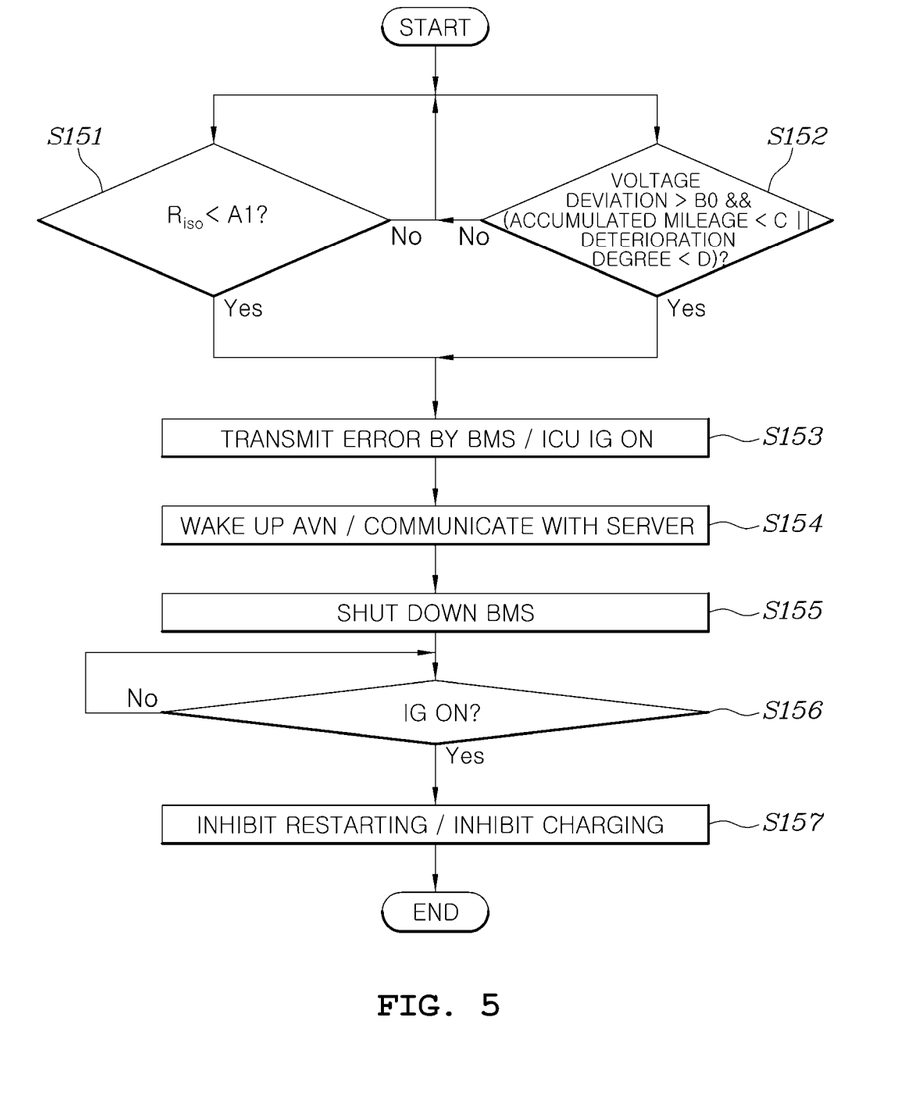

FIG. 4 is a flowchart illustrating in more detail the step of comparing the calculated parameter with the first reference value (S13 or S13') (hereinafter referred to as "first determining step"), and FIG. 5 is a flowchart illustrating in more detail the step of comparing the calculated parameter with the second reference value (S15 or S15') (hereinafter referred to as "second determining step").

As illustrated in FIG. 4, in the first determining step, the second controller 12 may perform a step of measuring an insulation resistance $R_{iso}$ of the battery 30 and comparing the measured insulation resistance $R_{iso}$ with a first reference value A0 (S131) and/or a step of calculating a voltage deviation between battery cells in the battery 30 and comparing the voltage deviation with a first reference value B0 (S132) when an accumulated mileage recorded in an odometer of the vehicle is smaller than a preset threshold value C or a calculated deterioration degree of the battery is smaller than a preset threshold value D. One of steps S131 and S132 is selectively applicable or both of them are applicable.

When the insulation resistance $R_{iso}$ of the battery 30 is smaller than the first reference value A0 or the voltage deviation between battery cells is greater than the first reference value B0, the second controller 12 may be shut down (S134) after storing an error code.

Subsequently, when the first controller 11 controls the vehicle to be in a power-on (IG ON) state by a driver's vehicle power-on input (S135), the second controller 12 may be woken up and display an alert corresponding to the stored error code through lighting on the cluster 20.

In addition, as illustrated in FIG. 5, in the second determining step, the second controller 12 may perform a step of measuring an insulation resistance $R_{iso}$ of the battery 30 and comparing the measured insulation resistance $R_{iso}$ with a second reference value A1 (S151) and/or a step of calculating a voltage deviation between battery cells in the battery 30 and comparing the voltage deviation with a second reference value B1 (S152) when an accumulated mileage recorded in an odometer of the vehicle is smaller than the preset threshold value C or a calculated deterioration degree of the battery is smaller than the preset threshold value D. One of steps S151 and S152 is selectively applicable or both of them are applicable.

The second reference value A1 compared with the insulation resistance of the battery may be smaller than the first reference value A0 compared with the insulation resistance of the battery in the first determining step. That is, the second reference value A1 smaller than the first reference value A0 may be applied to the second determining step so that it may be determined that the abnormal state of the battery is more serious due to a further decrease in the insulation resistance.

The second reference value B1 compared with the voltage deviation between battery cells may be greater than the first reference value B0 compared with the voltage deviation between battery cells in the first determining step. That is, the second reference value B1 greater than the first reference value B0 may be applied to the second determining step so that it may be determined that the abnormal state of the battery is more serious due to a further increase in the voltage deviation between battery cells.

When the insulation resistance $R_{iso}$ of the battery 30 is smaller than the second reference value A1 or the voltage deviation between battery cells is greater than the second reference value B1, the second controller 12 may not only store an error code but also notify the first controller 11 of the abnormality of the battery such that the first controller 11 controls controllers or devices in the vehicle to be powered on (IG ON) (S153), thereby waking up the AVN system 40, and provide information indicating that the battery is abnormal to an external server through the AVN system 40 by wireless communication (S154). Upon receipt of the information indicating that the battery is abnormal, the server may contact an emergency dispatcher or inform a driver's terminal of the abnormality of the battery, thereby making it possible to take an immediate action with respect to the battery.

Thereafter, the second controller 12 is shut down again by the power-off (IG OFF) control of the first controller 11 (S155). When the first controller 11 controls the vehicle to be powered on (IG ON) by a driver's vehicle power-on input (S156), the second controller 12 may be woken up, display an alert corresponding to the stored error code through lighting on the cluster 20, and control the main relay MR not to be turned on so that the vehicle may be prevented from being operated or charged, thereby inhibiting the vehicle from being restarted (S157).

As described above, in the system and the method for managing a battery of a vehicle according to various embodiments of the present disclosure, it is possible to prevent problems that may occur in the battery, such as ignition of the battery, in advance, by properly determining a state of the battery even in a power-off (IG OFF) state where the main relay connected to the battery of the vehicle is turned off and the controllers in the vehicle are turned off. In particular, in the system and the method for managing a battery of a vehicle according to various embodiments of the present disclosure, it is possible to enable the driver to take an appropriate action depending on how severe a problem occurring in the battery is by comparing parameters for determining a state of the battery with a plurality of reference values and appropriately alerting the problem depending on the severity.

The first controller 11 of the controller 10 may include a processor or a microprocessor. In addition, the first controller 11 may also include a memory. The aforementioned operations/functions of the first controller 11 can be embodied as computer readable code/algorithm/software stored on the memory thereof which may include a non-transitory computer readable recording medium. The non-transitory computer readable recording medium is any data storage device that can store data which can thereafter be read by the processor or the microprocessor. Examples of the computer readable recording medium include a hard disk drive (HDD), a solid state drive (SSD), a silicon disc drive (SDD), read-only memory (ROM), random-access memory (RAM), CD-ROM, magnetic tapes, floppy disks, optical data storage devices, etc. The processor or the microprocessor may perform the above described operations/functions of the first controller 11, by executing the computer readable code/algorithm/software stored on the non-transitory computer readable recording medium.

Similarly, the second controller 12 of the controller 10 may include a processor or a microprocessor. In addition, the second controller 12 may also include a memory. The aforementioned operations/functions of the second controller 12 can be embodied as computer readable code/algorithm/software stored on the memory thereof which may include a non-transitory computer readable recording medium. The processor or the microprocessor may perform the above described operations/functions of the second controller 12, by executing the computer readable code/algorithm/software stored on the non-transitory computer readable recording medium.

Alternatively, the controller 10 may include a processor or a microprocessor. In addition, the controller 10 may also include a memory. The aforementioned operations/functions of the controller 10 can be embodied as computer readable code/algorithm/software stored on the memory thereof which may include a non-transitory computer readable recording medium. The processor or the microprocessor may perform the above described operations/functions of the controller 10 by executing the computer readable code/algorithm/software stored on the non-transitory computer readable recording medium.

The effects obtainable from the present disclosure are not limited to the above-mentioned ones, and other effects that are not mentioned above may be clearly understood from the description above by those having ordinary knowledge in the field of technology to which the present disclosure pertains.

Although the present disclosure has been shown and described with respect to specific embodiments, it will be apparent to those having ordinary skill in the art that the present disclosure may be variously modified and altered without departing from the spirit and scope of the present disclosure as defined by the following claims.

What is claimed is:

1. A system for managing a battery of a vehicle comprising:
    a battery;
    a main relay connected to the battery to transfer or block power of the battery to components in the vehicle; and
    a controller configured to control the components in the vehicle to be in a power-off (IG OFF) state and turning off the main relay when receiving a vehicle power-off input, and to determine whether or not the battery is abnormal by calculating a parameter for determining a state of the battery and comparing the calculated parameter with a plurality of reference values that are preset,
    wherein the plurality of reference values includes a first reference value and a second reference value for determining that an abnormal level of the battery is higher than the first reference value.

2. The system of claim 1, wherein when it is determined that the battery is abnormal as a result of comparing the parameter with the first reference value, the controller compares the parameter with the second reference value to determine whether or not the battery is abnormal.

3. The system of claim 1, wherein the controller compares the parameter with both the first reference value and the second reference value at the same time to determine whether or not the battery is abnormal.

4. The system of claim 1, wherein when it is determined that the battery is abnormal as a result of comparing the parameter with the first reference value, the controller stores an error code and displays an alert corresponding to the error code on a cluster of the vehicle when the vehicle is powered on.

5. The system of claim 1, wherein when it is determined that the battery is abnormal as a result of comparing the parameter with the second reference value, the controller wakes up an audio video navigation (AVN) system in the vehicle, transmits information indicating that the battery is abnormal to an external server through the AVN system, and controls the vehicle not to be started when an input for powering on the vehicle is generated.

6. The system of claim 1, wherein the controller calculates an insulation resistance of the battery as the parameter, and the second reference value is smaller than the first reference value.

7. The system of claim 1, wherein when a deterioration degree of the battery or an accumulated mileage of the vehicle is smaller than a preset threshold value, the controller calculates a voltage deviation between battery cells in the battery as the parameter, and the second reference value is greater than the first reference value.

8. The system of claim 1, wherein the controller comprises a first controller and a second controller, and
    after turning off the main relay, the second controller receives power from the battery to determine whether or not the battery is abnormal by calculating the parameter and comparing the calculated parameter with the plurality of reference values.

9. A method for managing a battery of a vehicle including a battery and a main relay connected to the battery to transfer or block power of the battery to components in the vehicle, the method comprising:
- controlling the components in the vehicle to be in a power-off (IG OFF) state and turning off the main relay, by a controller, when a vehicle power-off input is received; and
- determining whether or not the battery is abnormal by calculating a parameter for determining a state of the battery and comparing the calculated parameter with a plurality of reference values that are preset, by the controller,
- wherein the plurality of reference values includes a first reference value and a second reference value for determining that an abnormal level of the battery is higher than the first reference value.

10. The method of claim 9, wherein when it is determined that the battery is abnormal as a result of comparing the parameter with the first reference value in the determining of whether or not the battery is abnormal, the controller compares the parameter with the second reference value to determine whether or not the battery is abnormal.

11. The method of claim 9, wherein in the determining of whether or not the battery is abnormal, the controller compares the parameter with both the first reference value and the second reference value at the same time to determine whether or not the battery is abnormal.

12. The method of claim 9, further comprising storing an error code and displaying an alert corresponding to the error code on a cluster of the vehicle when the vehicle is powered on, by the controller, when it is determined that the battery is abnormal as a result of comparing the parameter with the first reference value in the determining of whether or not the battery is abnormal.

13. The method of claim 9, further comprising waking up an audio video navigation (AVN) system in the vehicle, transmitting information indicating that the battery is abnormal to an external server through the AVN system, and controlling the vehicle not to be started when an input for powering on the vehicle is generated, by the controller, when it is determined that the battery is abnormal as a result of comparing the parameter with the second reference value in the determining of whether or not the battery is abnormal.

14. The method of claim 9, wherein in the determining of whether or not the battery is abnormal, the controller calculates an insulation resistance of the battery as the parameter, and the second reference value is smaller than the first reference value.

15. The method of claim 9, wherein in the determining of whether or not the battery is abnormal, when a deterioration degree of the battery or an accumulated mileage of the vehicle is smaller than a preset threshold value, the controller calculates a voltage deviation between battery cells in the battery as the parameter, and the second reference value is greater than the first reference value.

* * * * *